United States Patent
Huang et al.

(10) Patent No.: US 7,170,816 B2
(45) Date of Patent: Jan. 30, 2007

(54) METHOD AND APPARATUS FOR PASSING CHARGE FROM WORD LINES DURING MANUFACTURE

(75) Inventors: Jen-Ren Huang, Tainan (TW); Min-Hung Chou, Houlong Township (TW); Yi-Chun Shih, Zhongzheng District (TW)

(73) Assignee: Macronix International Co., Ltd., Hsinchu (TW)

( * ) Notice: Subject to any disclaimer, the term of this patent is extended or adjusted under 35 U.S.C. 154(b) by 90 days.

(21) Appl. No.: 11/014,258

(22) Filed: Dec. 16, 2004

(65) Prior Publication Data

US 2006/0133184 A1 Jun. 22, 2006

(51) Int. Cl.
*G11C 8/00* (2006.01)
(52) U.S. Cl. ............ 365/230.06; 365/204; 365/189.09
(58) Field of Classification Search .......... 365/230.06, 365/204, 189.09
See application file for complete search history.

(56) References Cited

U.S. PATENT DOCUMENTS

| | | | |
|---|---|---|---|
| 4,528,583 A | 7/1985 | te Velde et al. | |
| 4,635,230 A | 1/1987 | Thomas et al. | |
| 4,654,824 A | 3/1987 | Thomas et al. | |
| 4,669,180 A | 6/1987 | Thomas et al. | |
| 5,466,622 A | 11/1995 | Cappelletti | |
| 5,548,146 A | 8/1996 | Kuroda et al. | |
| 5,559,368 A | 9/1996 | Hu et al. | |
| 5,691,234 A | 11/1997 | Su et al. | |
| 5,760,445 A | 6/1998 | Diaz | |
| 5,776,807 A | 7/1998 | Ronkainen et al. | |
| 5,913,120 A | 6/1999 | Cappelletti | |
| 5,962,888 A | 10/1999 | Kim et al. | |
| 5,963,412 A | 10/1999 | En | |
| 5,985,709 A | 11/1999 | Lee et al. | |
| 5,994,742 A | 11/1999 | Krishnan et al. | |
| 5,998,299 A | 12/1999 | Krishnan | |
| 6,034,433 A | 3/2000 | Beatty | |
| 6,043,123 A | 3/2000 | Wang et al. | |
| 6,046,956 A * | 4/2000 | Yabe | 365/230.06 |
| 6,060,347 A | 5/2000 | Wang | |
| 6,066,879 A | 5/2000 | Lee et al. | |
| 6,080,658 A | 6/2000 | Huang et al. | |
| 6,113,648 A | 9/2000 | Schuelein et al. | |
| 6,166,584 A | 12/2000 | De | |
| 6,172,392 B1 | 1/2001 | Schmidt et al. | |
| 6,218,895 B1 | 4/2001 | De et al. | |

(Continued)

OTHER PUBLICATIONS

US 6,342,723, 01/2002, Wilford (withdrawn)

*Primary Examiner*—David Lam
(74) *Attorney, Agent, or Firm*—Kenta Suzue; Haynes Beffel & Wolfeld LLP (57) ABSTRACT

A plasma damage protection circuit includes a word line driver circuit with plasma damage protection features. If, during manufacture, plasma-based processes cause charge to build up on the word lines, the charge passes from the word lines through at least the word line drivers to the semiconductor substrate. Another plasma-based protection circuit includes a device coupled to multiple word line drivers. If, during manufacture, plasma-based processes cause charge to build up on the word lines, the charge passes from the word lines through at least the device to the semiconductor substrate. Thus, these plasma-based protection circuits save space while protecting the integrated circuit from plasma process-based damage.

39 Claims, 8 Drawing Sheets

U.S. PATENT DOCUMENTS

| | | |
|---|---|---|
| 6,252,280 B1 | 6/2001 | Hirano |
| 6,261,878 B1 | 7/2001 | Doyle et al. |
| 6,277,723 B1 | 8/2001 | Shih et al. |
| 6,291,281 B1 | 9/2001 | Wang et al. |
| 6,300,819 B1 | 10/2001 | De et al. |
| 6,306,691 B1 | 10/2001 | Koh |
| 6,307,233 B1 | 10/2001 | Awaka et al. |
| 6,313,503 B1 | 11/2001 | Lee et al. |
| 6,320,423 B1 | 11/2001 | Sato |
| 6,323,076 B1 | 11/2001 | Wilford |
| 6,365,938 B1 | 4/2002 | Lee et al. |
| 6,388,498 B1 | 5/2002 | Moriwaki et al. |
| 6,437,408 B1 | 8/2002 | Shih et al. |
| 6,466,489 B1 | 10/2002 | Ieong et al. |
| 6,468,848 B1 | 10/2002 | Awaka et al. |
| 6,512,700 B1 | 1/2003 | McPartland et al. |
| 6,534,833 B1 | 3/2003 | Duvvury et al. |
| 6,624,480 B1 | 9/2003 | Lin et al. |
| 6,664,140 B1 | 12/2003 | Lee et al. |

* cited by examiner

METHOD AND APPARATUS FOR PASSING CHARGE FROM WORD LINES DURING MANUFACTURE

BACKGROUND OF THE INVENTION

1. Field of the Invention

The present invention relates to integrated circuit devices, and more particularly to devices for protection of integrated circuits from plasma damage during manufacture.

2. Description of Related Art

The subject of protecting integrated circuits from plasma damage has received much attention from circuit designers interested in protecting device gates. In the manufacturing of integrated circuits, the processes include plasma treatments. For example, backend processing, such as metal etching, photoresist stripping, and deposition of dielectrics, involves plasma which induces charge on the structures being treated. The plasma-induced charge damages underlying structures in the device, including structures critical to device performance. For example, tunnel dielectrics used in flash memory and gate dielectrics are damaged by plasma-induced charge. Furthermore, the charge storage structures utilized in SONOS, N-bit memory (charge trapping memory cell that can trap charge at different positions of the charge trapping structure), and PHINES are particularly susceptible to damage by plasma-based processes.

The plasma-induced charge may be either positive or negative, and different types of damage can occur based on the type of plasma-induced charge.

Figure 1:
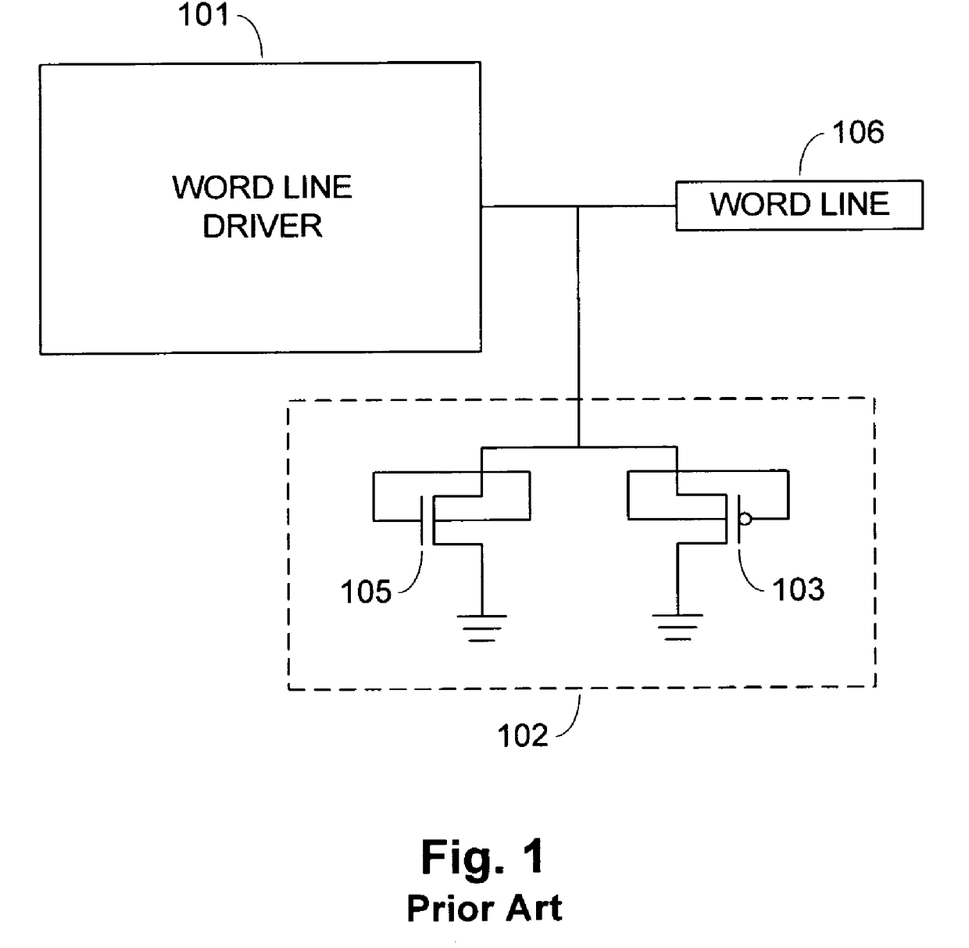
FIG. 1 is a schematic illustration of word line driver and protection CMOS transistor pair in the prior art.

In prior art semiconductor memory integrated circuits, each word line driver 101 is combined with its own protection circuit distinct from the word line driver 101, such as the CMOS transistor pair 102 shown in FIG. 1. The word line driver 101 provides different operation voltages to a word line 106 in the course of memory operations. The CMOS transistor pair 102, including PMOS 103 and NMOS 105, passes plasma-induced charge to the semiconductor substrate. The positive charge is passed through PMOS 103 and the negative charge is passed through NMOS 105. Each word line of the word line driver has its own protection circuit, such as a CMOS transistor pair. However, this design occupies a great deal of chip space and reduces the circuit density. This plasma protection circuit design presents an obstacle to the continued miniaturization of integrated circuit dimensions.

SUMMARY OF THE INVENTION

In one aspect of the invention, an integrated circuit comprises a semiconductor substrate, a memory array coupled to the substrate, word lines coupled to the memory substrate, and word line drivers. Each word line driver is coupled to the semiconductor substrate and at least one word line. The manufacturing process involves plasma-based processes which cause charge build up on word lines. If, during manufacture, charge builds up on a word line, the charge passes from the word line through a word line driver to the semiconductor substrate.

In another aspect of the invention, an integrated circuit comprises a semiconductor substrate, a memory array coupled to the substrate, word lines coupled to the memory substrate, word line drivers, and a device coupled to the word line drivers. For example, the device is a transistor with a gate that floats during plasma-based process manufacturing. If, during manufacture, charge builds up on word lines, the charge passes from the word lines through the device to the semiconductor substrate.

In one aspect of the invention, an integrated circuit comprises a semiconductor substrate, a memory array coupled to the substrate, word lines coupled to the memory substrate, word line drivers, and a device coupled to the word line drivers. Each word line driver is coupled to the semiconductor substrate and at least one word line. If, during manufacture, charge builds up on the word line, the charge passes from the word line to the semiconductor substrate. The charge passes through the device and/or a word line driver.

Another aspect of the invention is a method for manufacturing an integrated circuit device. A semiconductor substrate is provided. A memory array coupled to the semiconductor substrate is formed. Word lines coupled to the memory array are formed.

Word line drivers coupled to the word lines are formed. If, during manufacture, charge builds up on the word lines, charge is passed from the word lines through at least the word line drivers to the semiconductor substrate.

Another aspect of the invention is a method for manufacturing an integrated circuit device. A semiconductor substrate is provided. A memory array coupled to the semiconductor substrate is formed. Word lines coupled to the memory array are formed.

Word line drivers coupled to the word lines are formed. A device coupled to the word line drivers is formed. If, during manufacture, charge builds up on the word lines, charge is passed from the word lines through at least the device to the semiconductor substrate.

Yet another aspect of the invention is a method for manufacturing an integrated circuit device. A semiconductor substrate is provided. A memory array coupled to the semiconductor substrate is formed. Word lines coupled to the memory array are formed.

Word line drivers coupled to the word lines are formed. A device coupled to the word line drivers is formed. If, during manufacture, charge builds up on the word lines, charge is passed from the word lines to the semiconductor substrate. Some of the charge passes through at least the device. Some of the charge passes through the word line drivers.

In some embodiments, each word line driver includes a device coupled to the semiconductor substrate and the word line, such as a transistor, through which the charge passes on the way from the word line to the semiconductor substrate. By using one of the transistors of the word line driver, space is saved on the integrated circuit. For example, in the course of regular operation, the transistor couples a supply voltage to the word line during a memory operation. The transistor is of a certain charge type and passes charge of the same charge type. For example, holes building up on a word line pass from the word line through at least a p-type transistor in the word line driver to the semiconductor substrate, and electrons building up on a word line pass from the word line through at least an n-type transistor in the word line driver to the semiconductor substrate. In one embodiment, the transistor is formed in a well coupled to the semiconductor substrate. A current carrying terminal of the transistor, such as a source or drain, is coupled to the word line.

In some embodiments, charge passes through both the word line drivers and a device coupled to the word line drivers. In one embodiment, charge of the same type passes through both the word line drivers and the device coupled to the word line drivers. This has the advantage of providing extra safety by providing alternative paths from the word lines to the substrate, while still consuming much less space on the integrated circuit. In another embodiment, charge of one type passes through the device and charge of another type passes through the word line drivers. This has the advantage of minimizing the size of the integrated circuit. For example, electrons building up on the word lines pass through at least the device to the semiconductor substrate, and holes building up on the word lines pass through at least the word line drivers to the semiconductor substrate. In another example, holes building up on the word lines pass through at least the device to the semiconductor substrate, and electrons building up on the word lines pass through at least the word line drivers to the semiconductor substrate.

BRIEF DESCRIPTION OF THE DRAWINGS

The foregoing aspects and many of the attendant advantages of this invention will become more readily appreciated as the same become better understood by reference to the following detailed description, when taken in conjunction with the accompanying drawings, wherein.

DETAILED DESCRIPTION

Reference will now be made in detail to the exemplary embodiments of the invention. It should be noted that the drawings are in simplified form and are not to precise scale.

Although the disclosure herein refers to certain illustrated embodiments, it is to be understood that these embodiments are presented by way of example and not by way of limitation. The intent of the following detailed description, although discussing exemplary embodiments, is to be construed to cover all modifications, alternatives, and equivalents of the embodiments as may fall within the spirit and scope of invention as defined by the appended claims.

Figure 2:
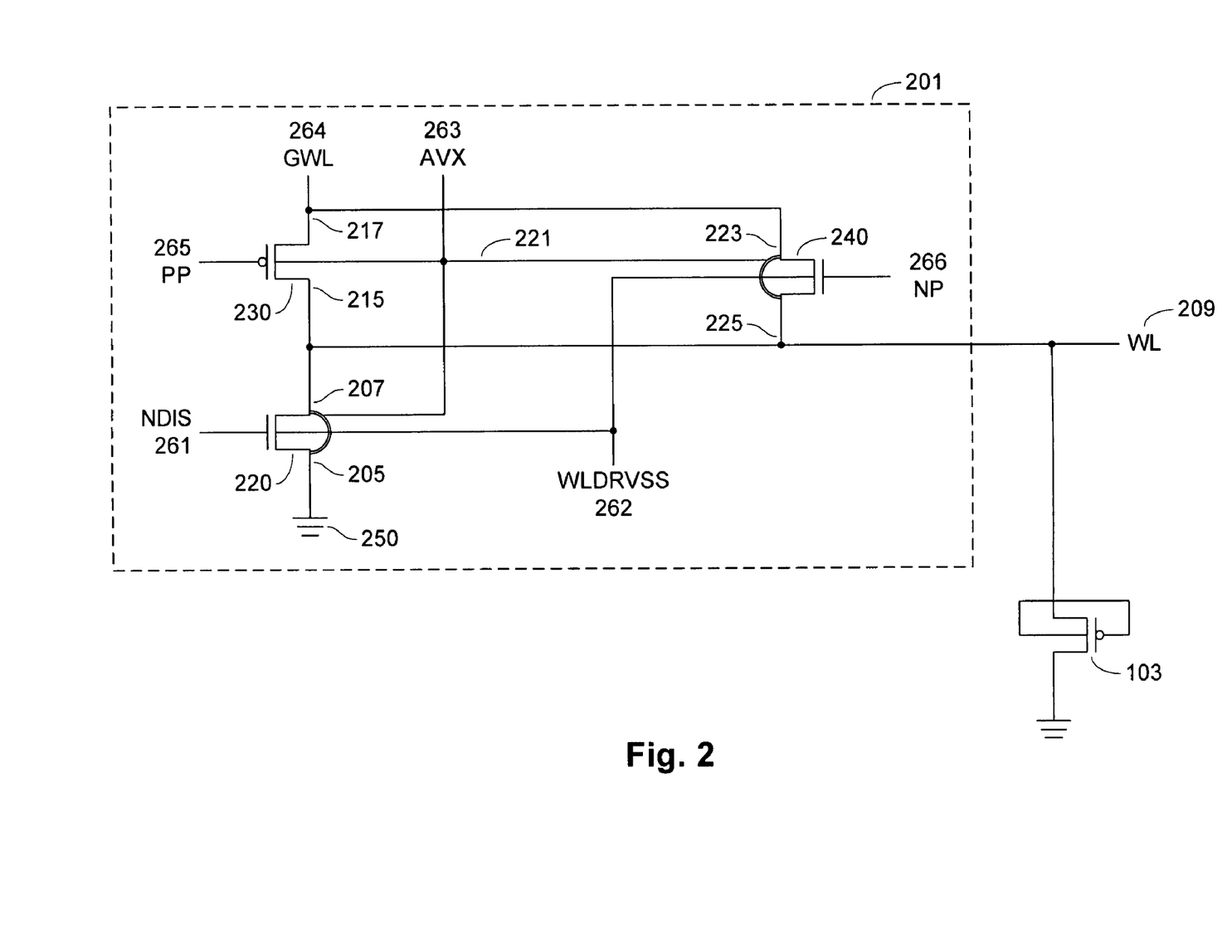
FIG. 2 shows a simplified diagram of a word line driver circuit with a device that passes charge from the word line to the semiconductor substrate during manufacture.

FIG. 2 illustrates a circuit including word line driver 201. The shown word line driver 201 includes two NMOS transistors 220 and 240 and a PMOS transistor 230. One of the source/drain terminals 205 of the NMOS transistor 220 is coupled to ground reference 250 which acts as a reference supply voltage during memory operations. The other of the source/drain terminals 207 of the NMOS transistor 220 is coupled to the word line 209.

The gate of the NMOS transistor 220 is coupled to the voltage NDIS 261 to turn on/off the NMOS transistor 220 during operation. The P well 211 of the NMOS transistor 220 is coupled to the voltage WLDRVSS 262 during operation. The N well 213 of the NMOS transistor 220 is coupled to the voltage AVX to prevent a PN junction effect during operation.

One of the source/drain terminals 215 of the PMOS transistor 230 is coupled to the word line 209. The other of the source/drain terminals 217 of the PMOS transistor 230 is coupled to voltage GWL 264 for memory operations such as program, erase and read. The N well of the PMOS transistor 230 is coupled to the N well of the NMOS transistor 240 via line 221. The gate of the PMOS transistor 230 is coupled to the voltage PP 265 to turn on/off the PMOS transistor 230 during memory operations.

One of the source/drain terminals 223 of the NMOS transistor 240 is coupled to one of the source/drain terminals 217 of PMOS transistor 230. The other of the source/drain terminals 225 of the NMOS transistor 240 is coupled to the word line 209. As stated above, the N well of the NMOS transistor 240 is coupled to the N well of the PMOS transistor 230 via line 221. The P well of the NMOS transistor 240 is coupled to voltage WLDRVSS 262 during memory operations. The gate of the NMOS transistor 240 is coupled to the voltage NP 266 to turn on/off the NMOS transistor 240 during memory operations.

A transistor PMOS 103 is coupled to each word line driver, and passes positive plasma-induced charge to the semiconductor substrate.

During the manufacturing process, the voltage PP 265, NDIS 261, and NP 266 are floating, so that the gates for the NMOS transistor 220 and 240, and PMOS transistor 230, are floating. During the manufacturing process, plasma-induced charge is passed from the word lines to the semiconductor substrate. Negative charge is passed from the word line 209, through NMOS transistor 220, to semiconductor substrate. Because negative charge is passed through NMOS transistor 220 functioning as part of the word line driver circuit 201 during memory operations, rather than through a separate NMOS transistor 105 dedicated for plasma protection for each word line driver, a great deal of space is saved in the integrated circuit. Positive charges are passed from word line 209, through PMOS transistor 103, and to the semiconductor substrate. The semiconductor substrate is the ground reference 250 for the whole integrated circuit. Therefore, the integrated circuit with the word line driver circuit can be protected from plasma charge having both positive and negative polarities.

While carrying out memory operations such as read, erase, and program, the following voltages characterize the operation of the word line driver:

|  | Erase | Program | Read |
|---|---|---|---|
| GWL | −4 V | 10 V | 2.7 V |
| AVX | VDD | 10 V | 2.7 V |
| PP | 0 V | 0 V | 0 V |
| NDIS | −4 V | 0 V | 0 V |
| NP | VDD | VDD | VDD |
| WLDRVSS | −4 V | 0 V | 0 V |
| WL | −4 V | 10 V | 2.7 V |

In the erase mode, NMOS transistor 220 is off because the gate bias NDIS=−4V.

Figure 3:
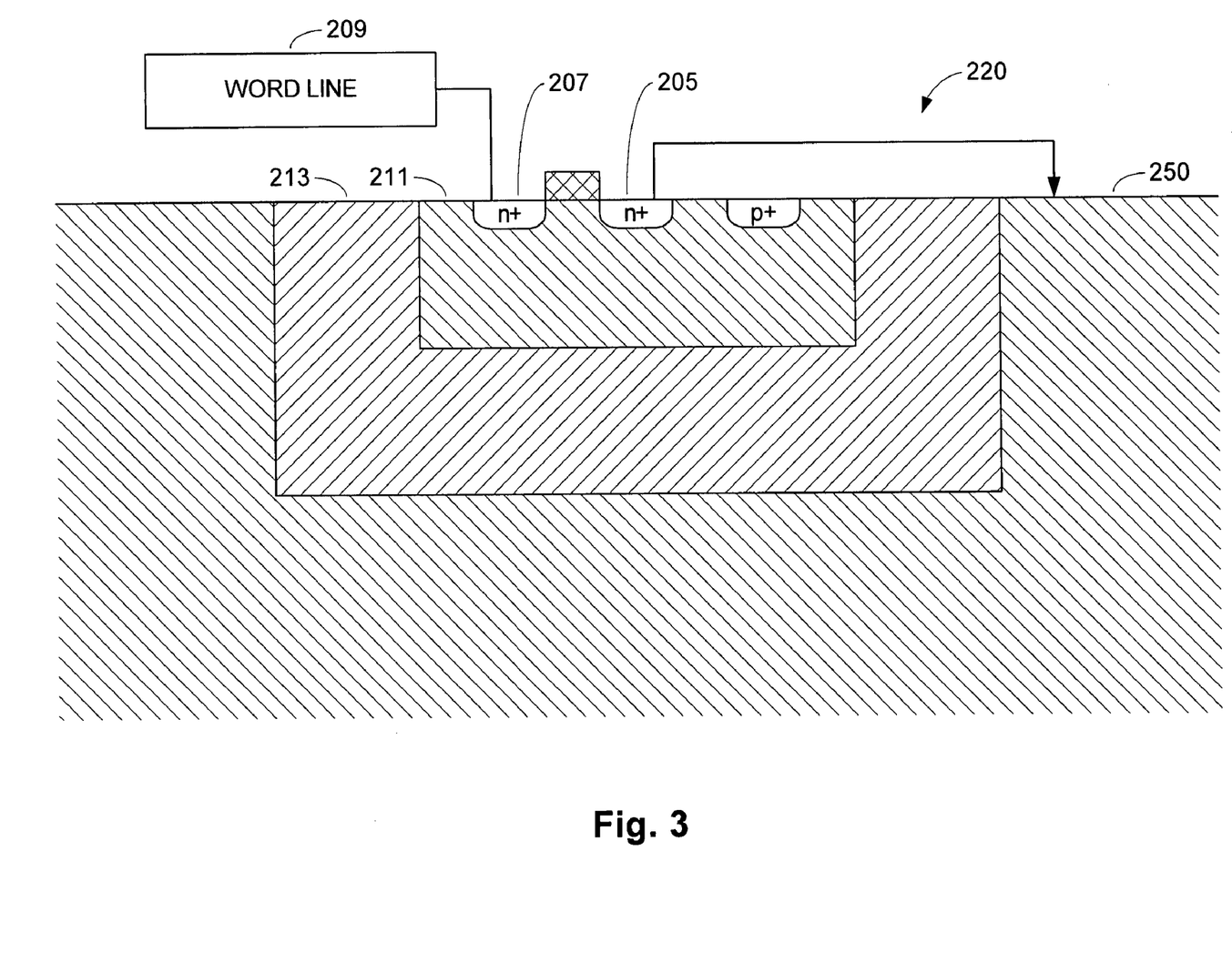
FIG. 3 shows a cross-sectional view of part of the word line driver circuit of FIG. 2.

FIG. 3 shows a cross sectional view of a portion of the circuitry of FIG. 2. One of the source/drain terminals 205 of the NMOS transistor 220 is coupled to ground reference 250 which acts as a reference supply voltage during memory operations. The other of the source/drain terminals 207 of the NMOS transistor 220 is coupled to the word line 209. NMOS transistor 220 is formed in the p well 211 which in turn is formed in the N well 213 which in turn is formed in the p-type substrate acting as a ground 250. During the manufacturing process, negative plasma-induced charge is passed from the word line 209, through NMOS transistor 220, and to the semiconductor substrate acting as a ground 250. Negative plasma-induced charge on the word line 209 causes the voltage of the word line 209 to be lower than the voltage of the p well 211. This turns on the p-n junction formed by terminal 207 and p well 211. Then the voltage of the p well 211 is negative relative to terminal 205. As a result, the n+ source/drain terminals 205 and 207 and the p well 211 conduct current via minority carrier injection, like a bipolar junction transistor in the active mode.

Figure 4:
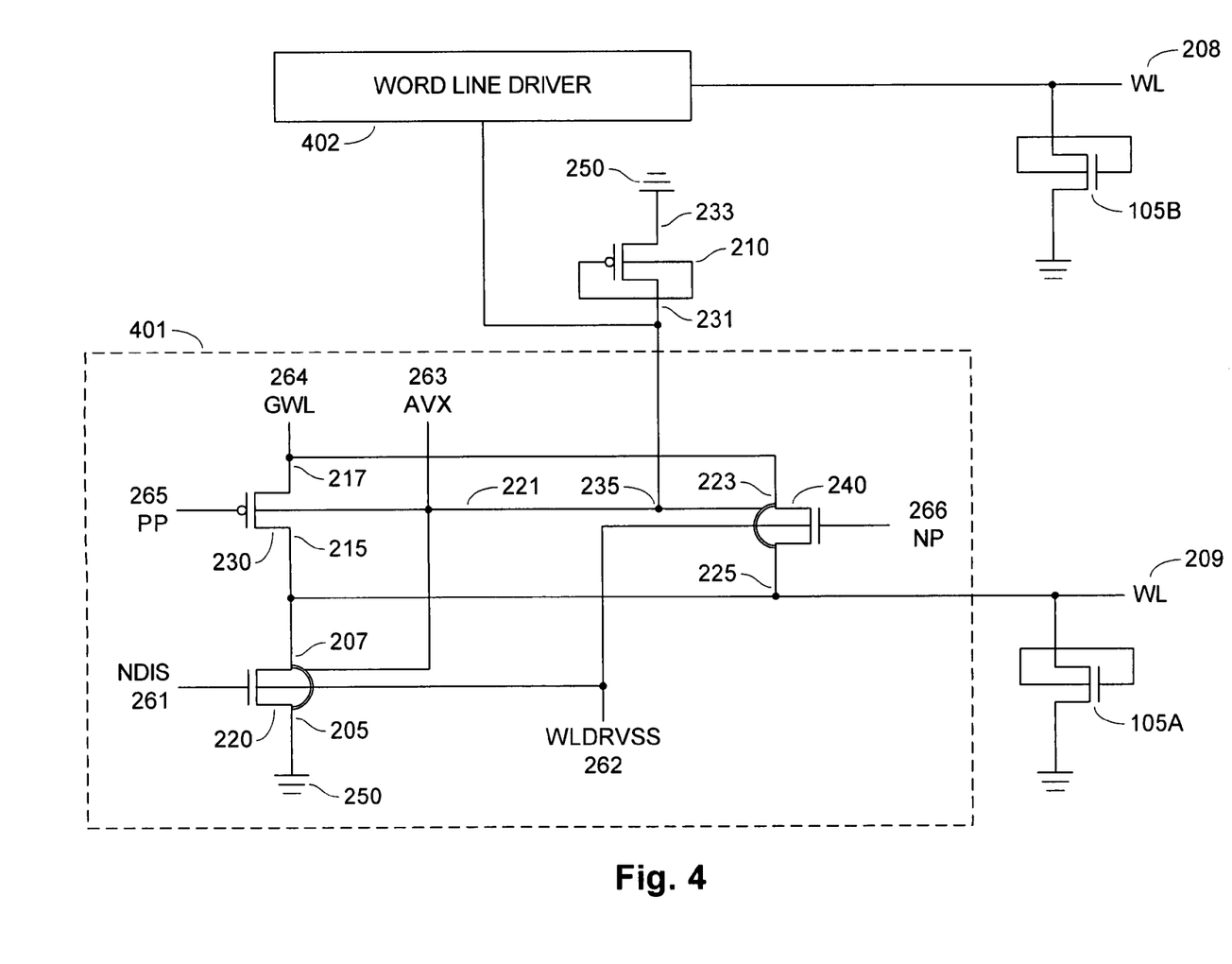
FIG. 4 shows a simplified diagram of multiple word line driver circuits coupled to a device that passes charge from multiple word lines to the semiconductor substrate.

FIG. 4 illustrates a circuit including word line drivers 401 and 402 coupled to word lines 209 and 208 respectively. The circuitry of word line drivers 401 and 402 is similar to the circuitry of word line driver 201 of FIG. 2. However, in FIG. 4, word lines 209 and 208 are coupled to plasma protection NMOS transistors 105A and 105B, respectively. During the manufacturing process, negative plasma-induced charge is passed from the word line 209, through NMOS transistor 105A, and to the semiconductor substrate acting as a ground 250. Similarly, negative plasma-induced charge is passed from the word line 208, through NMOS transistor 105B, and to the semiconductor substrate acting as a ground 250.

In FIG. 4, multiple word line drivers, such as word line drivers 401 and 402, are combined with a protection PMOS transistor 210. One of the source/drain terminals 231 of PMOS 210 is coupled to the node 235 on the line 221. The other of the source/drain terminals 233 of the PMOS transistor 210 is coupled to the semiconductor substrate acting as ground reference 250. The gate of the PMOS transistor 210 is coupled to the N well of the PMOS transistor 210, and voltage AVX1 is supplied on the gate to turn off PMOS 210 during memory operations.

During the manufacturing process, the voltage AVX1 is floating, so that the gate of protection PMOS transistor 210 is floating. Plasma-induced positive charges are passed from word line 209; through PMOS transistor 230, the line 221, and protection PMOS transistor 210; to the semiconductor substrate acting as ground reference 250. Thus, positive charge is passed through PMOS transistor 230 functioning as part of the word line driver circuit 401 during memory operations, and through a PMOS transistor 210 which acts as a plasma protection circuit for multiple word lines. A great deal of space is saved in the integrated circuit in contrast with having a separate NMOS transistor (e.g., 105A, 105B) for each word line driver for plasma protection.

Figure 5:
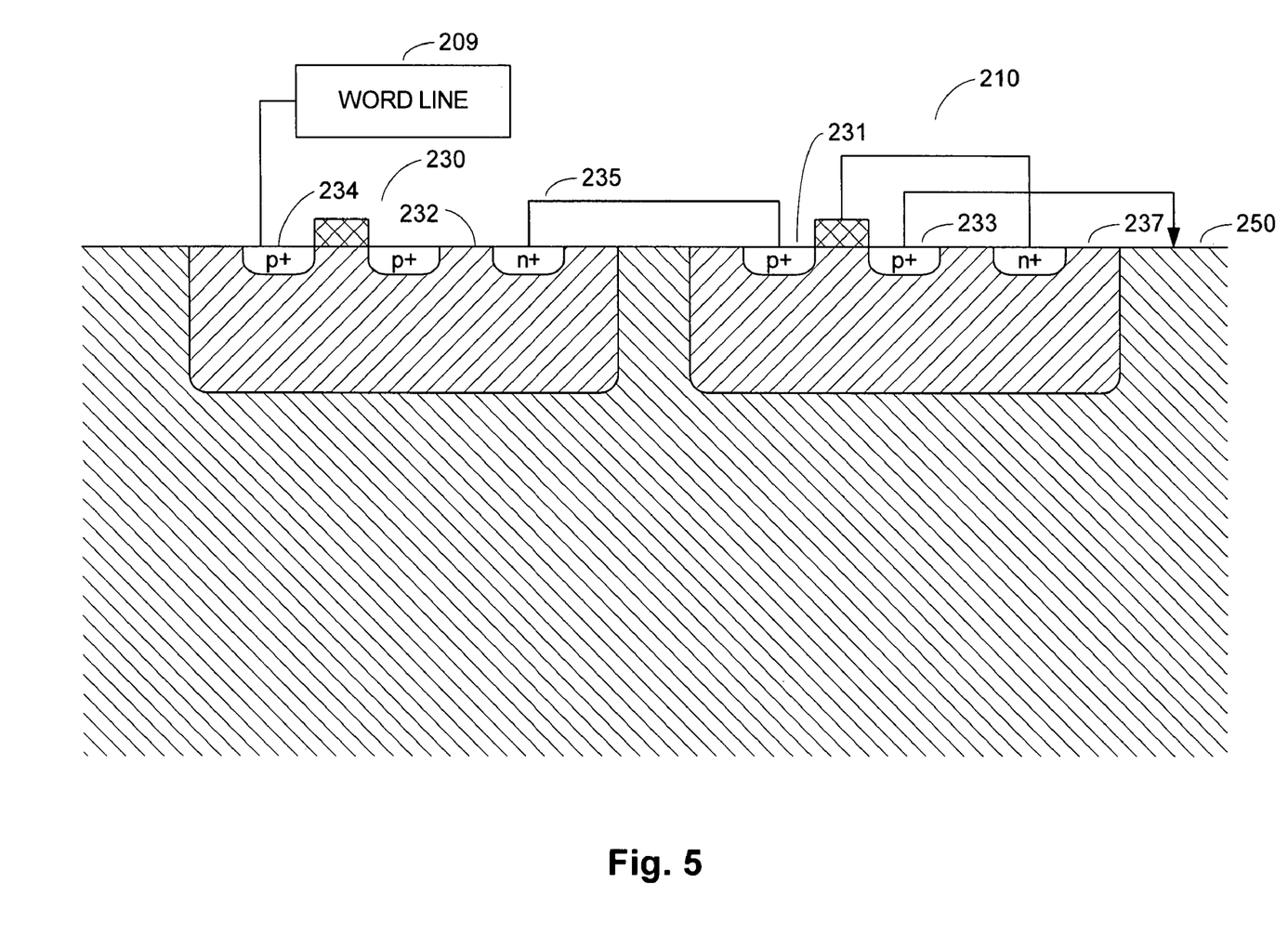
FIG. 5 shows a cross-sectional view of part of the word line driver circuits and device of FIG. 4.

FIG. 5 shows a cross-sectional view of a portion of the circuitry of FIG. 4. One of the source/drain terminals of the PMOS transistor 230 is coupled to the word line 209. One of the source/drain terminals 231 of protection PMOS transistor 210 is coupled to the node 235, which is coupled to the N-well of PMOS transistor 230. The other of the source/drain terminals 233 of the PMOS transistor 210 is coupled to the semiconductor substrate acting as ground reference 250. The gate of the PMOS transistor 210 is coupled to the N well of the PMOS transistor 210. During the manufacturing process, the gate of protection PMOS transistor 210 is floating. Positive plasma-induced positive charges are passed from word line 209; through PMOS transistor 230, the line 221, and protection PMOS transistor 210; and to the semiconductor substrate acting as ground reference 250. Positive plasma-induced charge on the word line 209 causes the voltage of the word line 209 to be higher than the voltage of the n well 232. This turns on the p-n junction formed by p+ terminal 234 and n well 232. As a result, the p+ terminal 234 and the n well 232 conduct current via diode action. The PMOS transistor 210 conducts hole current via minority carrier injection, similar to NMOS transistor 220 in FIG. 3. Positive plasma-induced charge on node 235 causes the voltage of the p+ terminal 231 to be higher than the voltage of then well 237. This turns on the p-n junction formed by p+ terminal 231 and n well 237. Then the voltage of the n well 237 is positive relative to p+ terminal 233. As a result, the p+ source/drain terminals 231 and 233 and the n well 237 conduct current via minority carrier injection, like a bipolar junction transistor in the active mode.

Figure 6:
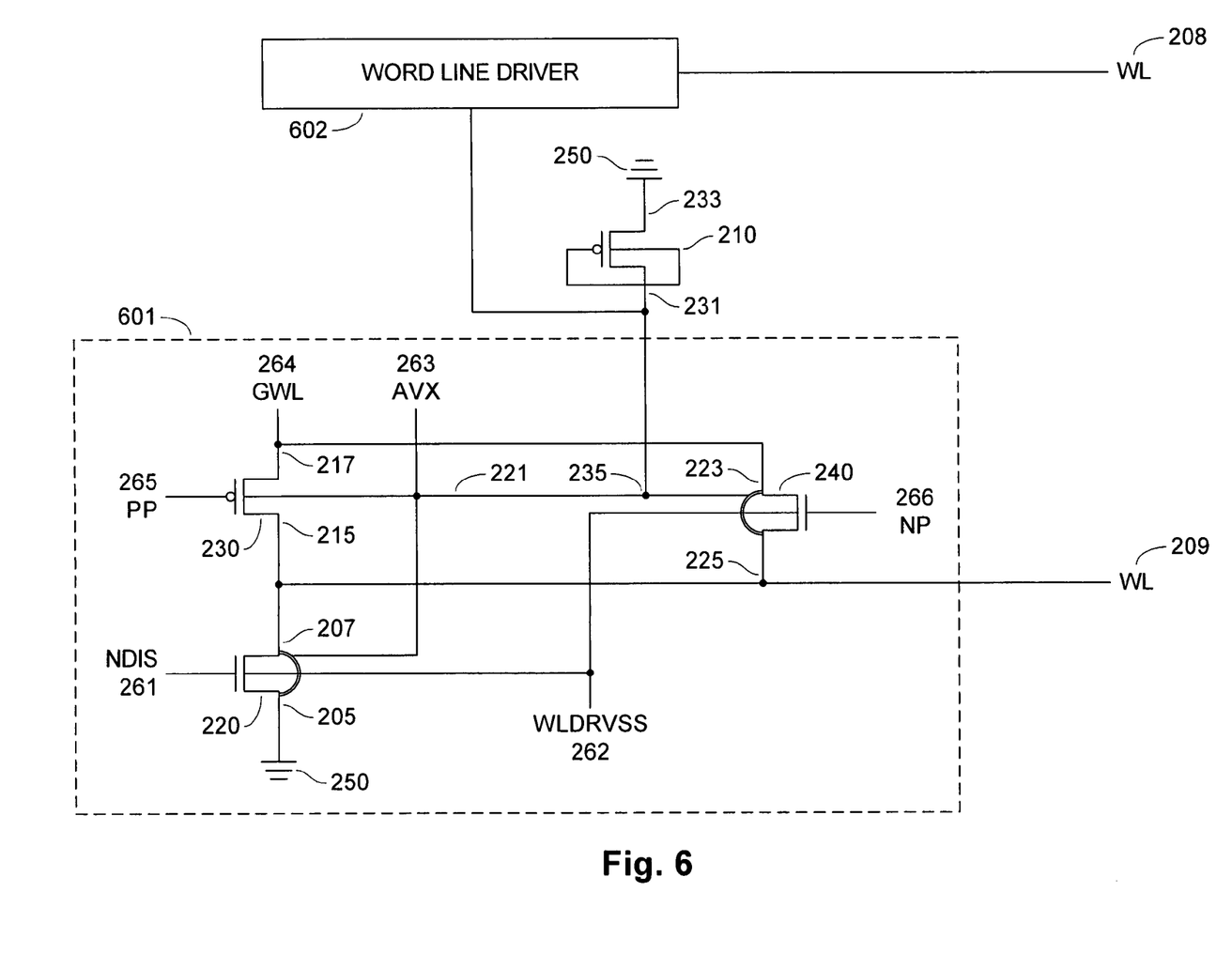
FIG. 6 shows a simplified diagram of multiple word line driver circuits each with a device that passes charge from the word line to the semiconductor substrate during manufacture. The multiple word line driver circuits are coupled to a device that passes charge from multiple word lines to the semiconductor substrate

FIG. 6 illustrates a circuit including word line drivers 601 and 602 coupled to word lines 209 and 208 respectively. The circuitry of word line drivers 601 and 602 is similar to the circuitry of word line driver 401 of FIG. 4. However, during the manufacturing process, negative plasma-induced charge is passed from the word line 209, through NMOS transistor 220, to the semiconductor substrate. Because negative charge is passed through NMOS transistor 220 functioning as part of the word line driver circuit 601 during memory operations, rather than through a separate NMOS transistor dedicated for plasma protection for each word line driver, a great deal of space is saved in the integrated circuit. Positive plasma-induced positive charges are passed from word line 209; through PMOS transistor 230, the line 221, and protection PMOS transistor 210; and to the semiconductor substrate acting as ground reference 250.

Figure 7:
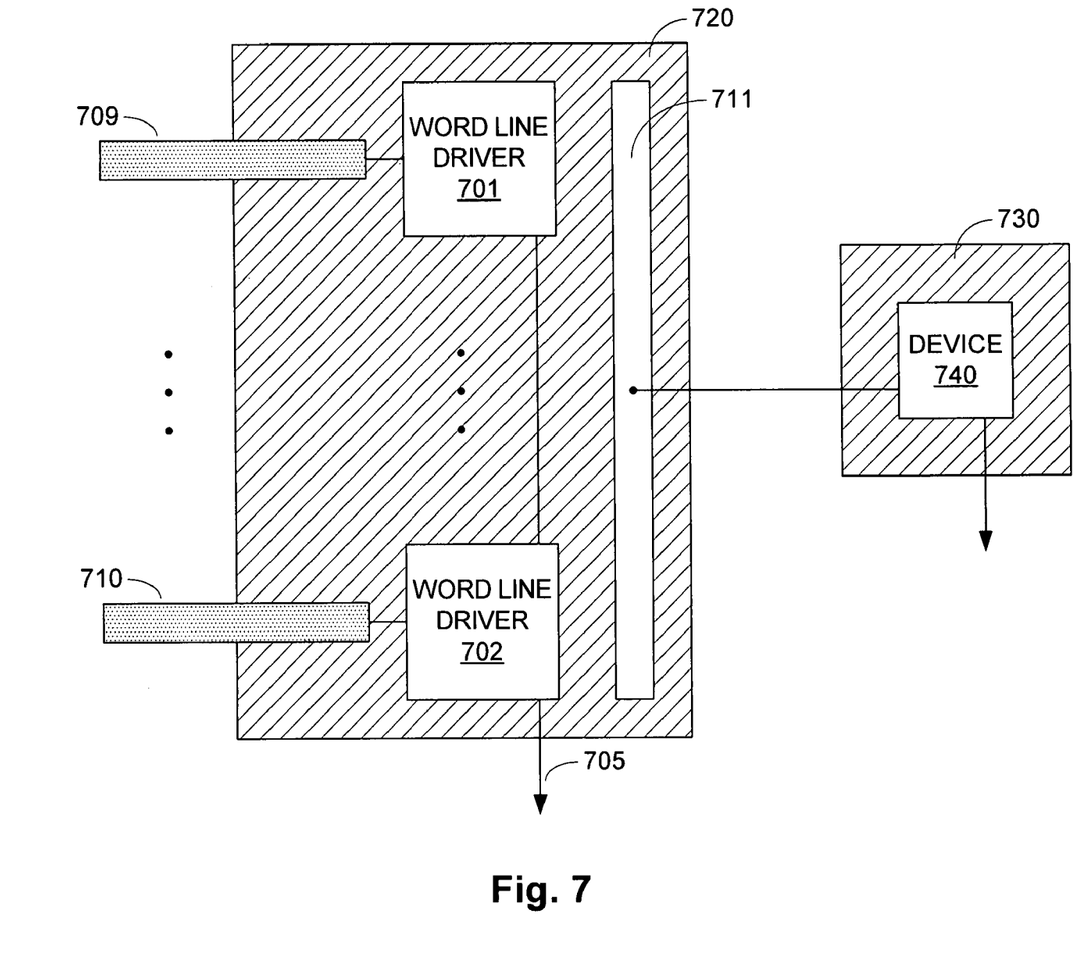
FIG. 7 illustrates a simplified plan view of one embodiment of the integrated circuit with the improved plasma protection circuitry.

FIG. 7 shows a plan view of a portion of the integrated circuit with a protection device 740 providing plasma protection to multiple word line drivers and multiple word lines. Multiple word lines such as word line 709 and 710 are arranged in parallel with each other. The multiple word lines are coupled to multiple word line driver circuits, such as word line drivers 701 and 702. The multiple word line driver circuits are formed in a well 720. Word line 709 is coupled to word line driver 701 and word line 710 is coupled to word line driver 702. Plasma-induced charge of a first conductivity type is passed from the word lines 709 and 710, through word line drivers 701 and 702 respectively, through conductive line 705, and to the substrate.

Plasma protection device 740 is formed in a well 730. The plasma protection device 740 is coupled to each of the word line drivers, including word line drivers 701 and 702, via a deep doped region 711, which acts as a well pick up. Plasma-induced charge of a second conductivity type is passed from the word lines 709 and 710, through word line drivers 701 and 702 respectively, through deep doped region 711, through plasma protection device 740, and to the substrate.

During the manufacturing of the integrated circuit, the connections among the word lines 709 and 710, the word line drivers 701 and 702, the deep doped region 711, the plasma protection device 740, and the substrate are formed before the first metal connection layer. The integrated circuit is protected from plasma charge having either positive or negative polarity.

Figure 8:
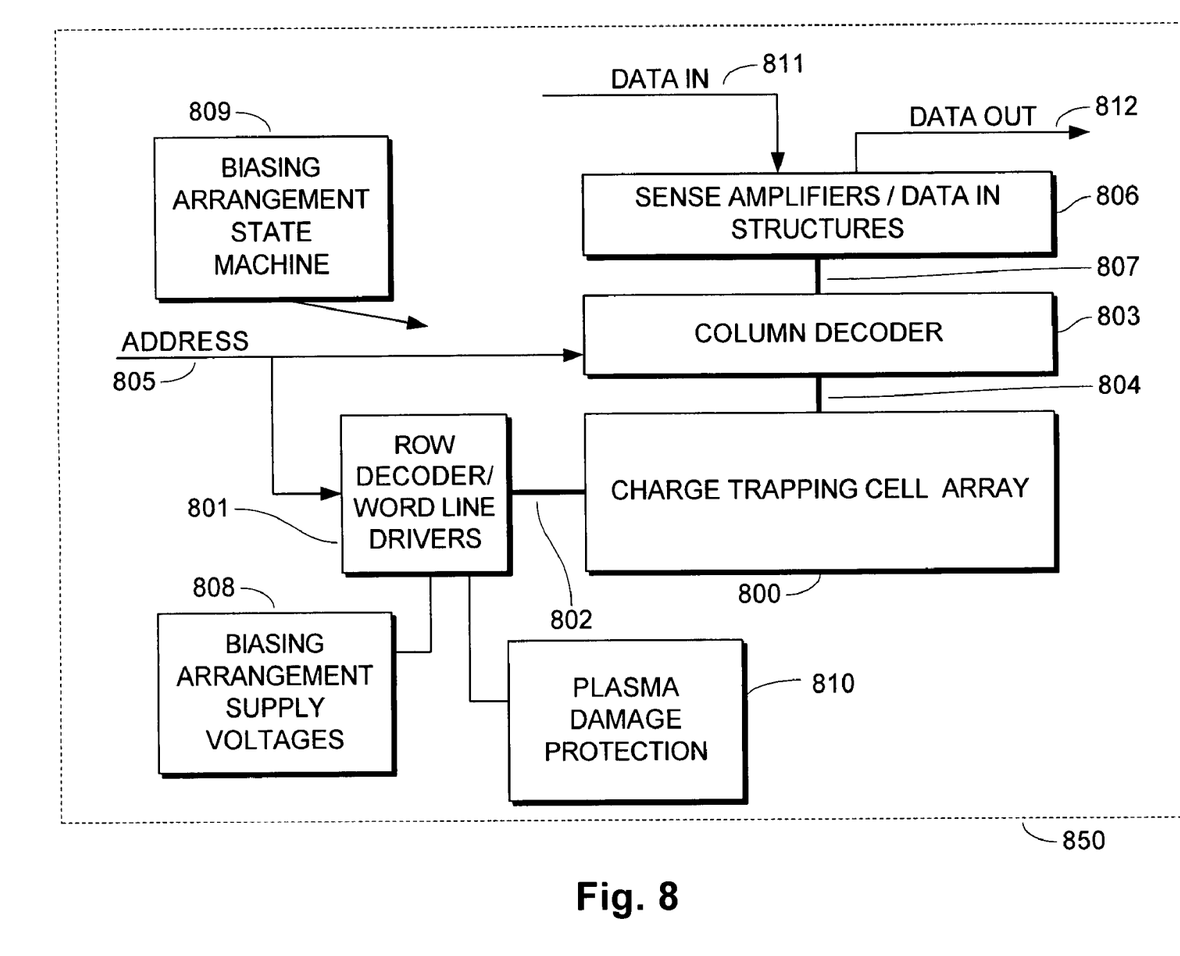
FIG. 8 shows a simplified block diagram of an integrated circuit embodiment with the improved plasma damage protection circuitry.

FIG. 8 is a simplified block diagram of an integrated circuit according to an embodiment of the present invention.

The integrated circuit 850 includes a memory array 800 implemented using localized charge trapping memory cells, on a semiconductor substrate. The supply voltages 808 supply power to the integrated circuit 850. Row decoder/word line drivers 801 are coupled to a plurality of word lines 802 arranged along rows in the memory array 800. A column decoder 803 is coupled to a plurality of bit lines 804 arranged along columns in the memory array 800. Addresses are supplied on bus 805 to column decoder 803 and row decoder/word line drivers 801. Sense amplifiers and data-in structures in block 806 are coupled to the column decoder 803 via data bus 807. Data is supplied via the data-in line 811 from input/output ports on the integrated circuit 850, or from other data sources internal or external to the integrated circuit 850, to the data-in structures in block 806. Data is supplied via the data-out line 812 from the sense amplifiers in block 806 to input/output ports on the integrated circuit 850, or to other data destinations internal or external to the integrated circuit 850. Plasma damage protection circuitry 810 is coupled to the row decoder/word line drivers 801. Biasing arrangement state machine 809 controls the biasing arrangements of the integrated circuit 850.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. An integrated circuit comprising:
a semiconductor substrate;
a memory array coupled to the semiconductor substrate;
a plurality of word lines coupled to the memory array; and
a plurality of word line drivers, each word line driver of the plurality of word line drivers including a component, wherein during a memory operation the component couples a voltage to at least a word line driver of the plurality of word line drivers,
wherein if during manufacture charge builds up on the word line, the component is coupled to the semiconductor substrate, and the charge passes from the word line through the component to the semiconductor substrate.

2. The circuit of claim 1, wherein the component is a transistor coupled to the semiconductor substrate and the word line, and the charge passes between the source and drain of the transistor via bipolar junction transistor action between the source and drain of the transistor.

3. The circuit of claim 1, wherein the component is a transistor coupled to the semiconductor substrate and the word line.

4. The circuit of claim 1, wherein the component includes a transistor of a first charge type, and the charge of the first charge type passes from the word line through at least the transistor to the semiconductor substrate.

5. The circuit of claim 1, wherein the component includes an n-type transistor coupled to the semiconductor substrate and the word line, and the charge includes electrons which pass from the word line through at least the n-type transistor to the semiconductor substrate.

6. The circuit of claim 1, wherein the component includes a p-type transistor coupled to the semiconductor substrate and the word line, and the charge includes holes which pass from the word line through at least the p-type transistor to the semiconductor substrate.

7. The circuit of claim 1, wherein the component includes a transistor in a well, the well being coupled to the semiconductor substrate, the transistor has a first current carrying terminal, the first current carrying terminal being coupled to the word line, charge from the word line passes through at least the transistor to the semiconductor substrate, and during a memory operation the transistor couples a supply voltage to the word line.

8. An integrated circuit comprising:
a semiconductor substrate;
a memory array coupled to the semiconductor substrate;
a plurality of word lines coupled to the memory array;
a plurality of word line drivers coupled to the plurality of word lines; and
a component coupled to the plurality of word line drivers,
wherein if during manufacture, charge builds up on word lines of the plurality of word lines, the charge passes from the word lines through at least the component to the semiconductor substrate.

9. The circuit of claim 8, wherein said component is coupled to a transistor in each word line driver of the plurality of word line drivers, and the charge passes through at least the transistor and the component to the semiconductor substrate.

10. The circuit of claim 8, wherein said component is coupled to a transistor in each word line driver of the plurality of word line drivers, and the charge passes through at least the transistor and the component to the semiconductor substrate, and
wherein during a memory operation the transistor couples a supply voltage to the word line.

11. The circuit of claim 8, wherein each word line driver of the plurality of word line drivers includes a transistor of a first charge type coupled to the device, said component is of a first charge type, and the charge of the first charge type passes from the word line through at least the transistor and the component to the semiconductor substrate.

12. The circuit of claim 8, wherein each word line driver of the plurality of word line drivers includes a p-type transistor coupled to the component, said component is another p-type transistor, and the charge includes holes which pass from the word line through at least the transistor and the component to the semiconductor substrate.

13. The circuit of claim 8, wherein each word line driver of the plurality of word line drivers includes an n-type transistor coupled to the component, said component is another n-type transistor, and the charge includes electrons which pass from the word line through at least the transistor and the component to the semiconductor substrate.

14. The circuit of claim 8, wherein said component includes a first current-carrying terminal, each word line driver of the plurality of word line drivers includes a transistor in a well, and the first current-carrying terminal is coupled to the well of the transistor, and the charge passes through at least the transistor and the component to the semiconductor substrate.

15. An integrated circuit comprising:
a semiconductor substrate;
a memory array coupled to the semiconductor substrate;
a plurality of word lines coupled to the memory array;
a plurality of word line drivers, wherein each word line driver of the plurality of word line drivers including a word line driver component coupled to the semiconductor substrate and at least a word line of the plurality of word lines, wherein during a memory operation the word line driver component couples a voltage to at least a word line driver of the plurality of word line drivers; and a component coupled to the plurality of word line drivers, wherein if during manufacture charge builds up on the word line, the charge passes from the word line to the semiconductor substrate through at least one of the component and the word line driver component.

16. The circuit of claim 15, wherein the charge includes a first charge type and a second charge type, and the charge of the first charge type passes from the word line to the semiconductor substrate through at least the component, and the charge of the second charge type passes from the word line to the semiconductor substrate through at least the word line driver component.

17. The circuit of claim 15, wherein the charge includes holes and electrons, and the holes pass from the word line to the semiconductor substrate through at least the component, and the electrons pass from the word line to the semiconductor substrate through at least the word line driver component.

18. The circuit of claim 15, wherein the charge includes holes and electrons, and the electrons pass from the word line to the semiconductor substrate through at least the component, and the holes pass from the word line to the semiconductor substrate through at least the word line driver component.

19. The circuit of claim 15, wherein the charge includes a first charge type, and part of the charge of the first charge type passes from the word line to the semiconductor substrate through at least the component, and part of the charge of the first charge type passes from the word line to the semiconductor substrate through at least the word line driver component.

20. A method for manufacturing an integrated circuit device, comprising:
providing a semiconductor substrate;
forming a memory array coupled to the semiconductor substrate;
forming a plurality of word lines coupled to the memory array;
forming a plurality of word line drivers coupled to the plurality of word lines, each word line driver of the plurality of word line drivers including a component, wherein during a memory operation the component couples a voltage to at least a word line driver of the plurality of word line drivers; and
passing charge from the plurality of word lines through the component to the semiconductor substrate if during manufacture the charge builds up on the word line.

21. The method of claim 20, wherein said passing includes bipolar junction transistor action between the source and drain of the transistor.

22. The method of claim 20, wherein the component includes a transistor.

23. The method of claim 20, wherein the component includes a transistor of a first charge type, and the charge of the first charge type passes from the word line though at least the transistor to the semiconductor substrate.

24. The method of claim 20, wherein the component includes an n-type transistor, and the charge includes electrons which pass from the word line through at least the n-type transistor to the semiconductor substrate.

25. The method of claim 20, wherein the component includes a p-type transistor, and the charge includes holes which pass from the word line through at least the p-type transistor to the semiconductor substrate.

26. The method of claim 20, further comprising forming a well in the semiconductor substrate,
wherein the component includes a transistor in the well.

27. A method for manufacturing an integrated circuit device, comprising:
providing a semiconductor substrate;
forming a memory array coupled to the semiconductor substrate;
forming a plurality of word lines coupled to the memory array;
forming a plurality of word line drivers coupled to the plurality of word lines;
forming a component coupled to the plurality of word line drivers; and
passing charge from word lines of the plurality of word lines through at least the component to the semiconductor substrate during manufacture, if during manufacture the charge builds up on the word lines.

28. The method of claim 27, wherein said forming the plurality of word line drivers includes forming in each word line driver a transistor, the transistor being coupled to the component, and the charge passes through at least the transistor and the component to the semiconductor substrate.

29. The method of claim 27, wherein said forming the plurality of word line drivers includes forming in each word line driver a transistor, the transistor being coupled to the component, and the charge passes though at least the transistor and the component to the semiconductor substrate, and
wherein during a memory operation the transistor couples a supply voltage to the word line.

30. The method of claim 27, wherein said forming the plurality of word line drivers includes forming in each word line driver a transistor of a first charge type, the transistor of the first charge type being coupled to said component, said component being of a first charge type, and the charge of the first charge type passes from the word line through at least the transistor and the component to the semiconductor substrate.

31. The method of claim 27, wherein said forming the plurality of word line drivers includes forming in each word line driver a p-type transistor, the p-type transistor being coupled to said component, said device being another p-type transistor, and the charge includes holes which pass from the word line through at least the p-type transistor and the component to the semiconductor substrate.

32. The method of claim 27, wherein said forming the plurality of word line drivers includes forming in each word line driver an n-type transistor, the n-type transistor being coupled to said component, said component being another n-type transistor, and the charge includes holes which pass from the word line through at least the n-type transistor and the component to the semiconductor substrate.

33. The method of claim 27, further comprising forming a well in the semiconductor substrate,
wherein said forming the plurality of word line drivers includes forming in each word line driver a transistor in the well, said component includes a first current-carrying terminal, and the first current-carrying terminal is coupled to the well of the transistor, and the charge passes through at least the transistor and the component to the semiconductor substrate.

34. A method for manufacturing an integrated circuit device, comprising:
providing a semiconductor substrate;
forming a memory array coupled to the semiconductor substrate;

forming a plurality of word lines coupled to the memory array;

forming a plurality of word line drivers coupled to the plurality of word lines, each word line driver of the plurality of word line drivers including a word line driver component, wherein during a memory operation the word line driver component couples a voltage to at least a word line driver of the plurality of word line drivers;

forming a component coupled to the plurality of word line drivers;

if during manufacture the charge builds up on the plurality of word lines, then passing charge from the plurality of word lines through at least the word line driver component to the semiconductor substrate; and passing charge from each word line of the plurality of word lines through at least the component to the semiconductor substrate during manufacture if during manufacture the charge builds up on the plurality of word lines.

35. The method of claim 34, wherein said passing includes bipolar junction transistor action between the source and drain of the transistor.

36. The method of claim 34, wherein the charge includes a first charge type and a second charge type, and the charge of the first charge type passes from the word line to the semiconductor substrate through at least the component, and the charge of the second charge type passes from the word line to the semiconductor substrate through at least the word line driver component.

37. The method of claim 34, wherein the charge includes holes and electrons, and the holes pass from the word line to the semiconductor substrate through at least the component, and the electrons pass from the word line to the semiconductor substrate through at least the word line driver component.

38. The method of claim 34, wherein the charge includes holes and electrons, and the electrons pass from the word line to the semiconductor substrate through at least the component, and the holes pass from the word line to the semiconductor substrate through at least the word line driver component.

39. The method of claim 34, wherein the charge includes a first charge type, and part of the charge of the first charge type passes from the word line to the semiconductor substrate through at least the component and part of the charge of the first charge type passes from the word line to the semiconductor substrate through at least the word line driver component.

* * * * *